(12) United States Patent
Takeuchi

(10) Patent No.: US 6,683,470 B2
(45) Date of Patent: Jan. 27, 2004

(54) DC TESTING APPARATUS AND SEMICONDUCTOR TESTING APPARATUS

(75) Inventor: Hideo Takeuchi, Tokyo (JP)

(73) Assignee: Advantest Corp., Tokyo (JP)

(*) Notice: Subject to any disclaimer, the term of this patent is extended or adjusted under 35 U.S.C. 154(b) by 71 days.

(21) Appl. No.: 10/111,621

(22) PCT Filed: Aug. 28, 2001

(86) PCT No.: PCT/JP01/07374
§ 371 (c)(1),
(2), (4) Date: Apr. 26, 2002

(65) Prior Publication Data
US 2002/0171448 A1 Nov. 21, 2002

(30) Foreign Application Priority Data
Aug. 31, 2000 (JP) ......................................... 2000-264029

(51) Int. Cl.$^7$ .............................................. G01R 31/26
(52) U.S. Cl. ...................................................... 324/765
(58) Field of Search ............................ 324/158.1, 73.1, 324/763, 765; 438/14, 17, 18; 714/724, 733, 734, 726

(56) References Cited

U.S. PATENT DOCUMENTS 5,477,139 A * 12/1995 West et al. ............... 324/158.1
5,790,411 A * 8/1998 Nelson ........................ 714/726
6,107,818 A * 8/2000 Czamara ..................... 324/765

FOREIGN PATENT DOCUMENTS

| JP | 3-138759 | 6/1991 |
| JP | 11-007795 | 1/1999 |
| JP | 2000-206206 | 7/2000 |

* cited by examiner

*Primary Examiner*—Vinh P. Nguyen
(74) *Attorney, Agent, or Firm*—Muramatsu & Associates

(57) ABSTRACT

The apparatus includes: a sequencer 11 for outputting a start signal, a timing signal, a write-in signal, and a clock signal sequentially, when an AD start signal is input; an ADC 12 for measuring an output of a device under test (DUT) 3 to which a test pattern is input, when the start signal is input; an arithmetic/logical unit (ALU) 13 for outputting an output voltage value of the ADC when the timing signal is input, and for outputting a result of comparing the output voltage value with an expected value to the pattern generator as a PASS/FAIL signal; an address counter 14 for updating an address value to be output when the clock signal is input; and a history memory for storing a measurement value in an address indicated by the address value when the write-in signal is input. This configuration makes it possible to measure each voltage value output from the DUT for a test pattern corresponding each AD start signal.

3 Claims, 4 Drawing Sheets

10 : DC testing apparatus

DC TESTING APPARATUS AND SEMICONDUCTOR TESTING APPARATUS

TECHNICAL FIELD

The present invention relates to a semiconductor testing apparatus and a DC testing apparatus constituting the semiconductor testing apparatus, and particularly, it relates to a DC testing apparatus suitable for testing a flash memory.

BACKGROUND ART

In a conventional DC testing apparatus which constitutes a semiconductor testing apparatus, a test pattern is input for each of the pins of a device under test (DUT) such as a flash memory, and the resultant output is compared with an expected value for detecting whether the DUT is defective or not.

The following will simply describe one example of the DC testing apparatus in the conventional semiconductor testing apparatus with reference to FIG. 4.

The example of the conventional DC testing apparatus comprises a sequencer 11, an analog/digital converter (ADC) 12, and an arithmetic/logical unit (ALU) 13.

When an AD start signal is input from a pattern generator (PG) 2 of a semiconductor testing apparatus, the sequencer 11 outputs a start signal and a timing signal in turn.

When the start signal is input from the sequencer 11, the ADC 12 measures an output of a DUT 3, which is input a test pattern generated by the PG 2. Here, a flash memory, which is tested, is shown as an example of the DUT 3.

Also, when the timing signal is input from the sequencer 11, the ALU 13 outputs an output voltage of the ADC 12 as a measurement value, and outputs a result of comparing this output voltage value with an expected value as a PASS/FAIL signal. This expected value is a value which is set at the ALU 13 beforehand, and which is to be output when the flash memory is normal.

When the output voltage value of the ADC 12 matches the expected value, the ALU 13 outputs the PASS signal, and when it does not match, the ALU 13 outputs the FAIL signal. This PASS/FAIL signal is typically given in the state of a binary signal and is represented by, for example, "1" or "0".

On the other hand, the ALU 13 outputs the output voltage value as an output voltage of the DUT 3 directly, which is analog/digital-converted in the ADC 12.

The PASS/FAIL signal output from the ALU 13 is input to the PG 2.

The test patterns, which are input from the PG 2 to the DUT 3, are changed one by one in accordance with the PASS/FAIL signal input from the ALU 13. At the time of each change operation, either of the two test patterns is selected according to whether the PASS or FAIL signal is given. That is, one of the branches of the test pattern is sequentially selected.

For each selected test pattern, an AD start signal is input from the PG 2 to the sequencer 11. Then, the ADC 12 measures an output of DUT 3 to which the test pattern is input, and new PASS/FAIL signals are output from the ALU 13 one after another.

Thus, each time the test is conducted, a plurality of test patterns is input for each of the DUT pins and the AD start signal is output. This AD start signal is output as many times as, for example, a few tens of times for each test.

However, the output voltage value given as a measurement value from the ALU has conventionally been only an output voltage value measured corresponding to a test pattern when the last AD start signal is output. That is, conventionally, it has been impossible to directly confirm an actual output value of the DUT against each of the test pattern except the last test pattern.

Also, sometimes an output signal is judged that an output voltage value converted by the ADC matches an expected value by the ALU even when actually it is only barely satisfied with an allowable range of an expected value or is actually abnormal because it matches the expected value accidentally. In such a case, although naturally the FAIL signal indicative of abnormality must be output, actually the PASS signal indicative of normality may be output. Thus, it would deteriorate the reliability of the DC test.

In view of the above, it is an object of the present invention to provide a DC measuring apparatus and a semiconductor testing apparatus that can measure an output voltage value placed from a DUT corresponding to a test pattern which is given each time when the AD start signal is input for easy debugging a test program and a test pattern of DC tests.

DISCLOSURE OF THE INVENTION

In order to achieve this object, a DC testing apparatus in claim 1 of the present invention comprises a sequencer for outputting a start signal, a timing signal, a write-in signal, and a clock signal sequentially, when an AD start signal for each test pattern is input from a pattern generator for generating the test pattern to be input to a device under test (DUT); an analog/digital converter for measuring an output of said DUT to which the test pattern is input, when said start signal is input; an arithmetic/logical unit (ALU) for outputting an output voltage value of said analog/digital converter as a measurement value, when said timing signal is input, and for outputting a result of comparing said output voltage value with an expected value to said pattern generator as a PASS/FAIL signal; an address counter for updating an address value to be output, when said clock signal is input; and a history memory for storing said measurement value in an address indicated by said address value, when said write-in signal is input.

According to such a constitution, each time when the AD start signal is input to the sequencer, the write-in signal and the clock signal are output following the start signal and the timing signal. This clock signal is used to update an address value in the address counter. Further, the write-in signal is used to store a voltage value output in the history memory. Therefore, each time when the AD start signal is given, the address of the history memory, which stores each output voltage value, is updated.

Therefore, according to the present invention, it is possible to individually retain each output voltage value for each AD start signal. As a result, it is possible to individually measure each voltage value output from the DUT against a test pattern for each AD start signal.

Thus, according to the present invention, because each voltage value output from the DUT against a test pattern for each AD start signal can be measured, it is possible to analyze in detail the output of the DUT for each of the test patterns. As a result, even when the PASS/FAIL signal comes in the PASS signal, it is possible to detect such a case that the measurement value hardly matched the allowable range of an expected value or that it accidentally matched the expected value but is actually decided to be abnormal.

By then modifying the test pattern or the expected value based on the result of the detection, it is possible to reduce the probability of the PASS signal indicative of normality being output in such a case that the FAIL signal indicative of abnormality should be output originally. Therefore, the reliability of the DC test would be improved.

Furthermore, because the output of the DUT for each test pattern can be discussed in detail, based on the discussion result, the DUT itself can be improved at its development stage. Therefore, by using a DC testing apparatus of the present invention at the stage of developing a DUT such as a flash memory, it is possible to contribute to the development of the improved DUT in performance.

BEST MODE FOR CARRYING OUT THE INVENTION

The following will describe embodiments of the present invention with reference to the drawings.
First Embodiment First, a semiconductor testing apparatus, especially a DC testing apparatus according to the embodiment is described with reference to FIG. 1.

Figure 1:
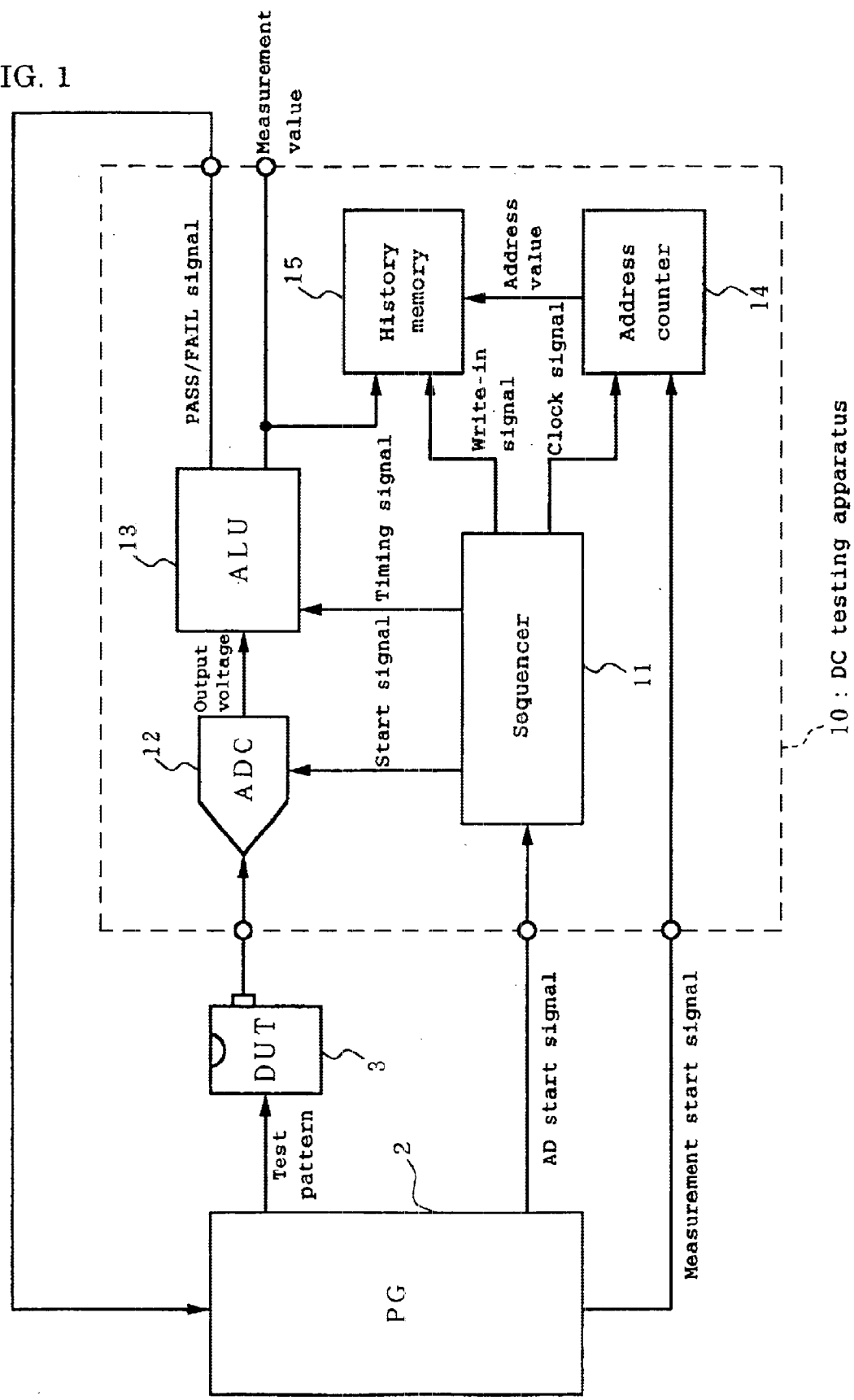
FIG. 1 is a block diagram for showing a configuration of a semiconductor testing apparatus according to a first embodiment of the present invention.

As shown in FIG. 1, the semiconductor testing apparatus of this embodiment comprises a pattern generator (PG) 2 and a DC testing apparatus 10. The PG 2 generates a test pattern to be input to a device under test (DUT) 3 and also outputs an AD start signal for each test pattern.

The DC testing apparatus 10 comprises a sequencer 11, an analog/digital converter (ADC) 12, an arithmetic/logical unit (ALU) 13, an address counter 14, and a history memory 15.

Next, the operations of each of the components of the DC testing apparatus are described with reference to FIG. 2.

Figure 2:
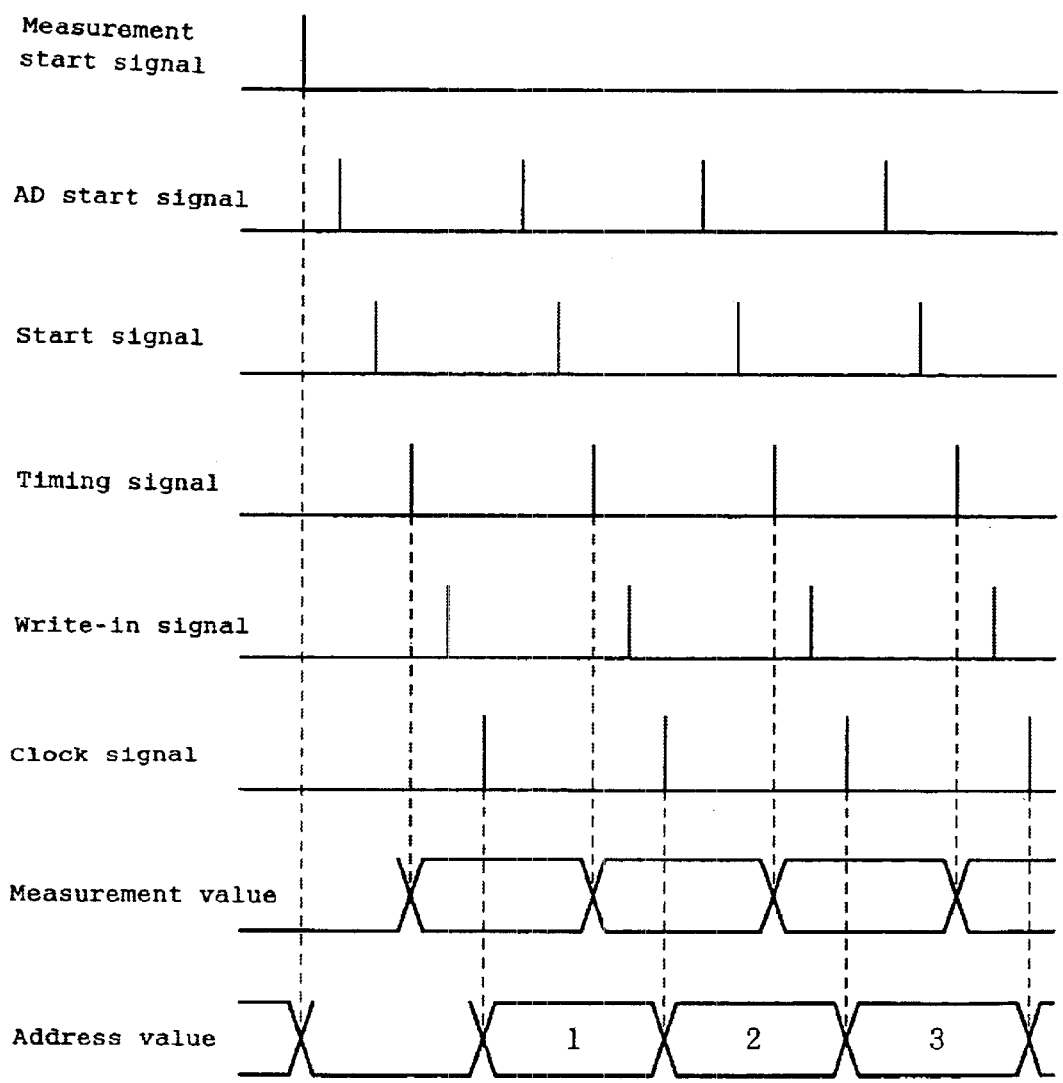
FIG. 2 is a timing chart for showing operations of a DC testing apparatus according to the first embodiment of the present invention.

FIG. 2 shows a timing chart for showing the operations of the DC testing apparatus. As shown in FIG. 2, in this embodiment, prior to start of measurement, the PG 2 inputs a measurement start signal to an address counter 14 first. When the measurement start signal is input, the address value of the address counter 14 is reset to an initial value.

Also, after outputting the measurement start signal, PG 2 outputs the test pattern and the AD start signal. The test pattern is generated at a frequency of, for example, a few MHz-20 MHz. The AD start signal, on the other hand, is output at a frequency of, for example, 10 kHz or less, providing that the timing for outputting each AD start signal can be adjusted to match the operations of the DC testing apparatus 10.

The sequencer 11 sequentially outputs the start signal, the timing signal, the write-in signal, and the clock signal each time the AD start signal is input from the PG 2.

The ADC 12 measures an output of the DUT to which a test pattern has been input, when the start signal is input, like in the case of a conventional example. Also, the ALU 13 outputs a voltage value output from the ADC as a measurement value when the timing signal is input, and then outputs a result of comparing this output voltage value with an expected value to the PG 2 as the PASS/FAIL signal.

The address counter 14 reset by the measurement start signal, on the other hand, updates its output address value when the clock signal is input from the sequencer 11. FIG. 2 shows an example where the address value is incremented to "1", "2" and "3" in turn.

The history memory 15 stores a voltage value output, when the write-in signal is input from the sequencer 11, as a measurement value from the ALU 13 in an address indicated by an address value. Because the address value is incremented each time the AD start signal is input, an output voltage value for each AD start signal can be retained individually.

For example, as shown in FIG. 2, an output voltage value which corresponds to a test pattern when the AD start signal is input for the first time is stored in such an area in the history memory that is indicated by an address value "0". An output voltage value obtained correspondingly when the AD start signal is input for the second time is stored in an area given by an address value "1". Thus, the output voltage values obtained correspondingly when the AD start signals are input for the third time onward are stores in areas given by the address values "2" and the subsequence respectively.

Figure 3:
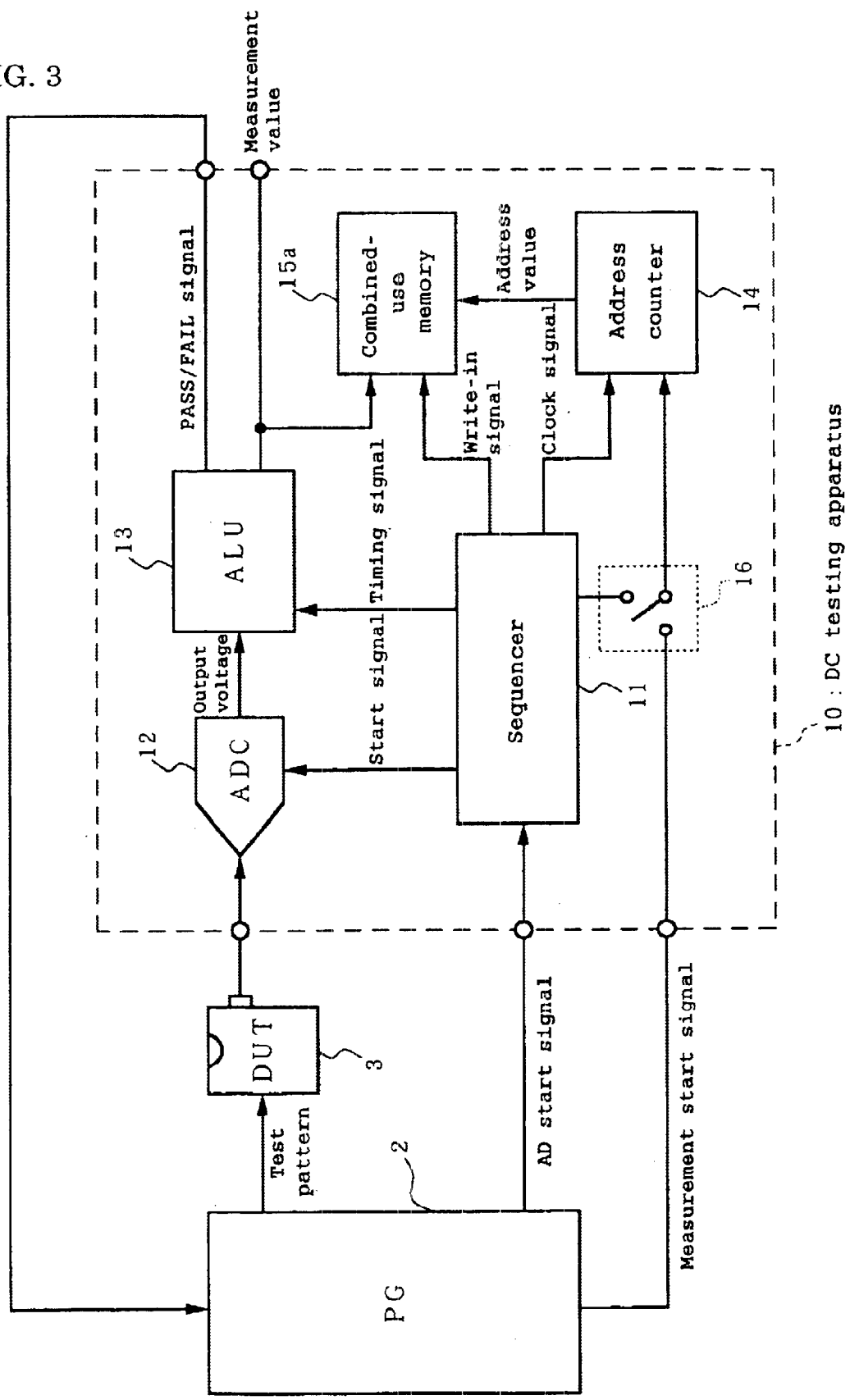
FIG. 3 is a block diagram for showing a configuration of the semiconductor testing apparatus according to a second embodiment of the present invention.
Figure 4:
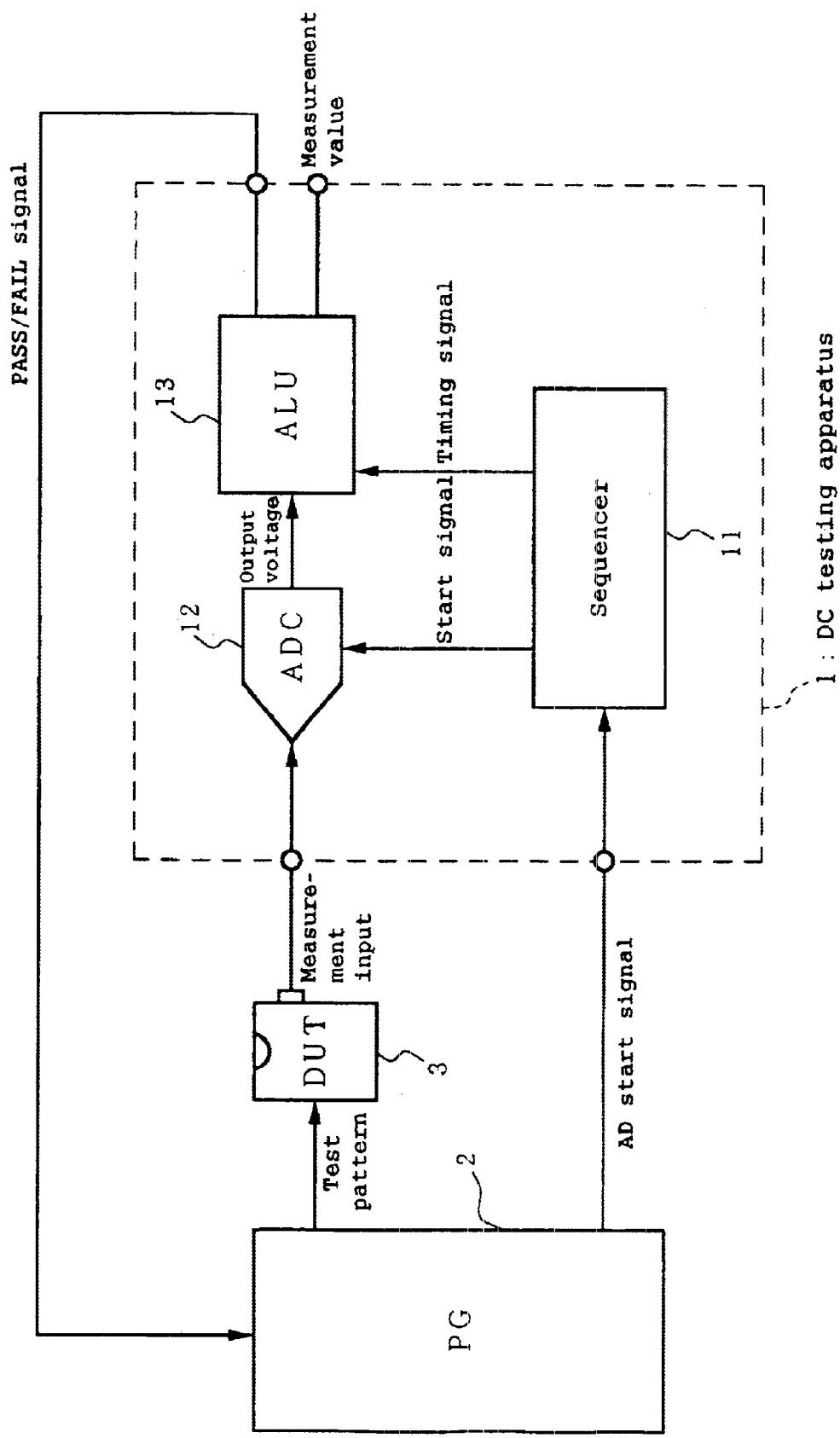
FIG. 4 is a block diagram for showing a configuration of a conventional semiconductor testing apparatus.

Thus, because an output voltage value for each AD start signal can be individually stored, a voltage value output from the DUT for a test pattern each time the AD start signal is input can be measured individually. As a result, because each output voltage value can be discussed individually, it is possible to improve the reliability of the test patterns.
Second Embodiment The following will describe a second embodiment of the present invention with reference to FIG. 3.

The DC testing apparatus of the second embodiment comprises, in place of the history memory of the DC testing apparatus of the first embodiment shown in FIG. 1, a combined-use memory 15a which consists of a memory of the conventional DC testing apparatus for storing each of measurement values obtained by a plurality of measurements, each time one AD start signal is input.

To use the combined-use memory 15a as a history memory, like in the case of the first embodiment, the clock signal input to the address counter 14 and the write-in signal input to the combined-use memory 15a are output once from the sequencer 11 each time the measurement by the AD start signal ends. The measurement start signal is also input to the address counter 14 once each time the measurement starts.

On the contrary, for the use of the combined-use memory 15a for storing measurement values given by measuring a plurality of times for each AD start signal in order to obtain an average measurement value conventionally, each time the AD start signal is input, the clock signal and the write-in signal are output as the same times as the start signal is output from the sequencer 11 to the ADC 12. In addition, in place of the measurement start signal sent from the PG, a signal synchronized with the AD start signal is input to the address counter 14 from the sequencer 11.

As understood from the above, the second embodiment employs different timings and kinds of the signal corresponding to purposes of using the combined-use memory 15a. In the second embodiment, therefore, inside the sequencer 11, the clock signal and the write-in signal can be switched in output timing and also the measurement start signal input to the address counter 14 can be switched by the switch 16.

Therefore, according to the second embodiment, without adding a new memory, an output voltage value for each AD start signal can be individually retained, and each voltage value output from the DUT against a test pattern each time the AD start signal is input can be measured.

Thus, in the second embodiment, a memory apparatus can be switched to a mode of storing a measurement value for each AD start signal a plurality of times, and a mode of storing each output voltage value for each AD start signal.

It is here noted that in the second embodiment it is not capable of retaining an average measurement value for each AD start signal when the combined-use memory is used to obtain an average measurement value as conventionally. However, if a new history memory is provided besides the conventional memory like in the case of the first embodiment, an average value can be obtained over a plurality of measurements conducted for each AD start signal and then each average value can be retained.

Although the above embodiments have been described with reference to the example where the present invention is configured under specific conditions, the present invention may be subject to a variety of changes. For example, although these embodiments have been described with the case where the address value of the address counter is incremented, the present invention is not limited thereto in updating of the address value. For example, the address value of the address counter may be decremented for each AD start signal.

Furthermore, although the above embodiments have been described with the case where a flash memory is tested as the DUT, the present invention is not limited thereto in terms of DUT.

Additionally, although the above embodiments have been described with the example where the measurement start signal is input from the pattern generator to the address counter, the present invention is not limited thereto; for example, the measurement start signal may be input from an external device other than the pattern generator.

POSSIBILITY OF INDUSTRIAL UTILIZATION

As described above, the DC testing apparatus and the semiconductor testing apparatus of the present invention are well suited for use in the test of the direct current characteristics of a semiconductor device.

What is claimed is:

1. A DC testing apparatus comprising:
    a sequencer for outputting a start signal, a timing signal, a write-in signal, and a clock signal sequentially, when an AD start signal for each test pattern is input from a pattern generator for generating the test pattern to be input to a device under test (DUT);
    an analog/digital converter for measuring an output of said DUT to which the test pattern is input, when said start signal is input;
    an arithmetic/logical unit (ALU) for outputting an output voltage value of said analog/digital converter as a measurement value, when said timing signal is input, and for outputting a result of comparing said output voltage value with an expected value to said pattern generator as a PASS/FAIL signal;
    an address counter for updating an address value to be output, when said clock signal is input; and
    a history memory for storing said measurement value in an address indicated by said address value, when said write-in signal is input.

2. The DC testing apparatus according to claim 1, wherein said history memory comprises a memory apparatus that stores each measurement value obtained through a plurality of measurements by inputting one said AD start signal.

3. A semiconductor testing apparatus equipped with a DC testing apparatus, wherein:
    said DC testing apparatus comprises:
        a pattern generator for generating a test pattern to be input to a device under test, and for outputting an AD start signal for each test pattern;
        a sequencer for outputting a start signal, a timing signal, a write-in signal, and a clock signal sequentially, when said AD start signal is input;
        an analog/digital converter for measuring an output of said DUT to which the test pattern is input, when said start signal is input;
        an arithmetic/logical unit for outputting an output voltage value of said analog/digital converter as a measurement value, when said timing signal is input, and for outputting a result of comparing the output voltage value with an expected value to said pattern generator as a PASS/FAIL signal;
        an address counter for updating an address value to be output, when said clock signal is input; and
        a history memory for storing the measurement value in an address indicated by said address value, when said write-in signal is input.

* * * * *